United States Patent
Staab et al.

(10) Patent No.: US 6,476,480 B1
(45) Date of Patent: Nov. 5, 2002

(54) PRESS-FIT IC POWER PACKAGE AND METHOD THEREFOR

(75) Inventors: Paul C. Staab, Carmel, IN (US);
Pankaj Mithal, Kokomo, IN (US);
Patrick A. Davis, Greentown, IN (US);
Stephen P. Barlow, Noblesville, IN (US)

(73) Assignee: Delphi Technologies, Inc., Troy, MI (US)

( * ) Notice: Subject to any disclaimer, the term of this patent is extended or adjusted under 35 U.S.C. 154(b) by 65 days.

(21) Appl. No.: 09/612,729

(22) Filed: Jul. 10, 2000

(51) Int. Cl.[7] ................................ H01L 23/48
(52) U.S. Cl. ...................... 257/693; 257/690
(58) Field of Search ................. 257/727, 693, 257/690, 773, 786

(56) References Cited

U.S. PATENT DOCUMENTS 5,851,855 A * 12/1998 Ferla et al. ............... 438/129
6,166,464 A * 12/2000 Grant ....................... 310/68

* cited by examiner

Primary Examiner—Roy Potter
(74) Attorney, Agent, or Firm—Jimmy L. Funke

(57) ABSTRACT

An IC power package particularly suitable for use as a rectifier for an automotive ac generator, as well as an IC packaging method. The power package comprises an electrically-conductive base, a MOSFET die mounted to the base so that the drain region of the MOSFET is electrically connected to the base, an electrically-conductive pin mounted to the die and electrically connected to the source region of the MOSFET, and an electrically-conductive member electrically connected to the gate region of the MOSFET. The conductive member can take several forms, including a second pin or a leadframe mounted to the die, or an annular-shaped member mounted to the base by an electrically-insulative member. In the latter embodiment, the annular-shaped member may be electrically connected to the gate region with a bond wire. The die is preferably encapsulated on the base, so that the base, pin and conductive member provide three connections for a rugged IC package.

55 Claims, 3 Drawing Sheets

PRESS-FIT IC POWER PACKAGE AND METHOD THEREFOR

TECHNICAL FIELD

The present invention generally relates to integrated circuit (IC) packaging. More particularly, this invention relates to an IC power package and packaging method for a generator rectifier bridge, in which the package employs a metal-oxide-semiconductor field effect transistor (MOSFET).

BACKGROUND OF THE INVENTION

Diodes are conventionally used in rectifier bridges for ac generators used in automotive applications. The diodes are often formed as press-fit packages with two connections that enable the packages to be readily installed in the rectifier bridge. One connection is made with a conductive base connected to one terminal of the diode, while the second connection is made with a pin connected to the opposite terminal of the diode. The package is installed by pressing the base into a bridge bracket, and then brazing the pin to the bridge circuit.

Automotive generators equipped with conventional diode-based rectifier bridges can be challenged as the number and power requirements of automobile accessories and systems increase, particularly as a result of low generator output at idle conditions. In certain applications, a larger generator or a battery with a higher rated output must be used, incurring both a size and weight penalty for the automobile. From a system standpoint, it would be advantageous to replace all of the rectifier diodes of an automotive ac generator with field effect transistors (FET) to allow for more precise control of the generator DC output. AC-DC conversion through FETs would allow phase shifting and power factor control, enabling higher charging system efficiency especially at low engine rpms. Such a capability would be especially desirable for automobiles equipped with a large number of power-hungry systems. However, FETs require three connections—one each for the source, drain and gate. Accordingly, the replacement of a diode-based rectifier bridge package with an FET-based package would appear to require a redesigned rectifier bridge and potentially additional system modifications, all of which are undesirable from a system and assembly standpoint.

SUMMARY OF THE INVENTION

The present invention provides an IC power package particularly suitable for use as a rectifier for an automotive ac generator, as well as an IC packaging method. The power package comprises an electrically-conductive base, a MOSFET die mounted to the base so that the drain region of the MOSFET is electrically connected to the base, an electrically-conductive pin mounted to the die and electrically connected to the source region of the MOSFET, and an electrically-conductive member electrically connected to the gate region of the MOSFET. The conductive member can take several forms, including a second pin or a leadframe mounted to the die, or an annular-shaped member mounted to the base by an electrically-insulative member. In the latter embodiment, the annular-shaped member may be electrically connected to the gate region with a bond wire. The die is preferably encapsulated on the base, yielding a rugged IC package with three connections provided by the base, pin and conductive member.

In view of the above, it can be appreciated that the base and pin of the IC package of this invention can be substantially similar to that of a conventional diode-based rectifier package. Therefore, the IC package of this invention is compatible with existing generator rectifier bridge designs, so that only minimal modifications are required to use the package with conventional generator designs. The packaging method of this invention is also uncomplicated, and amenable to fixturing and conventional processing to yield a package whose base, pin and conductive member are precisely aligned for installation.

With the IC package of this invention, more precise control of an ac generator output can be achieved than with conventional diode-based rectifier bridges. Also possible are phase shifting and power factor control, enabling higher charging system efficiency especially at low engine rpms. The IC package of this invention achieves these advantages without requiring a redesigned rectifier bridge or other significant system modifications, even though the package has one more connection than that required for a diode-based rectifier bridge. Finally, while particularly suitable for use with ac generators, the present invention and its advantages should find use in a variety of applications, including high wattage audio/video equipment, electric motor controllers, etc.

Other objects and advantages of this invention will be better appreciated from the following detailed description.

DESCRIPTION OF THE PREFERRED EMBODIMENT

Figure 1:
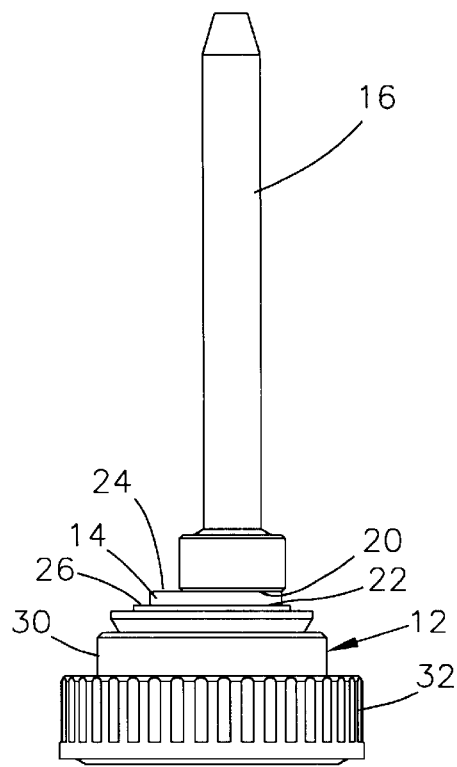
FIGS. 1 through 3 illustrate process steps for assembling an IC power package in accordance with a first embodiment of this invention.
Figure 2:
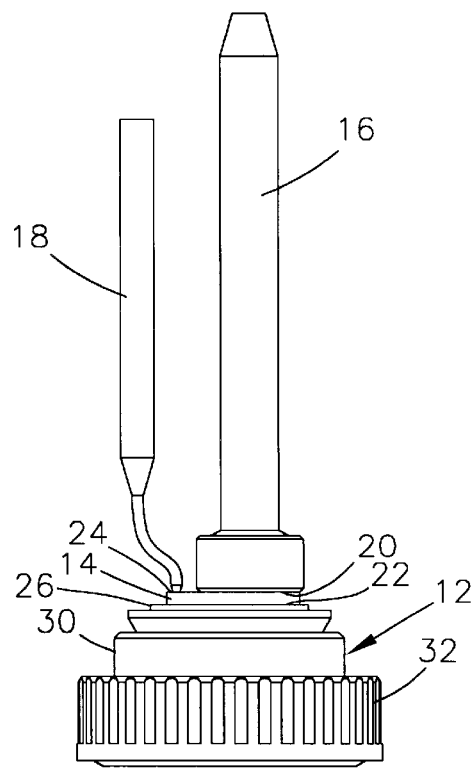
Figure 3:
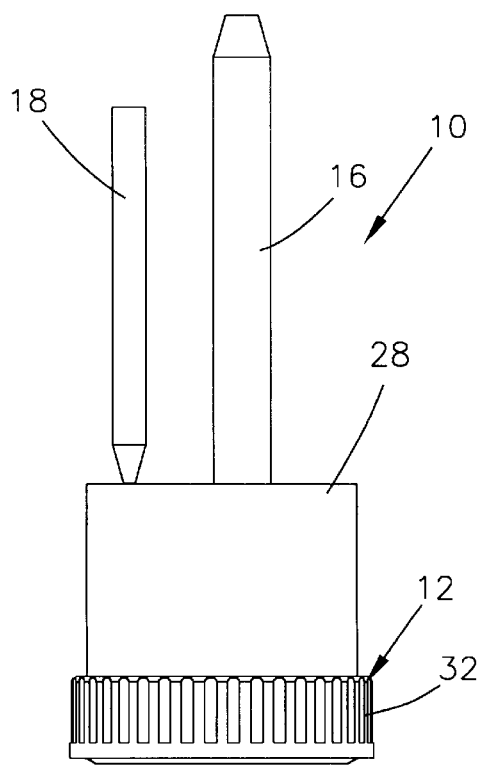

Represented in FIGS. 1 through 3 are three process steps in the assembly of an IC power package 10 in accordance with a first embodiment of this invention. The package 10, as well as alternative package designs represented in FIGS. 5 through 10, is configured to replace a conventional diode-based rectifier for an automotive ac generator. Consequently, while similar in appearance to a diode-based package, the package 10 employs a FET transistor instead of a diode, necessitating the inclusion of a third electrical lead in the package 10. The package 10 has an electrically-conductive base 12, a MOSFET die 14 mounted to the base 12, and a pair of pins 16 and 18 mounted to the die 14. The pin 16 is centrally-disposed along the axis of the disk-shaped base 12, while the pin 18 is offset and parallel to the pin 16. The die 14 has source, drain and gate contacts 20, 22 and 24, respectively, for the source, drain and gate regions of the MOSFET. The source and gate contacts 20 and 24 are shown as being on an upper surface of the die 14, with the pins 16 and 18 electrically connected to the source and gate contacts 20 and 24, respectively. The drain contact 22 is shown as being on the lower surface of the die 14 to electrically contact an axial surface 26 of the base 12.

In FIG. 1, the die 14 has been positioned on the base 12, and the pin 16 registered with the source contact 20 of the die 14. The pin 18 is shown as having been registered with the gate contact 24 in FIG. 2. Connections between the base 12 and pins 16 and 18 with the contacts 20, 22 and 24 are preferably by soldering, though other attachment methods could be used. To promote solder adhesion, the surfaces of the base 12 and pins 16 and 18 to be soldered are preferably grooved (not shown). At the process level represented by FIG. 2, solder (not shown) has been provided at the contacts 20, 22 and 24, such as by depositing a solder paste on the contacts 20, 22 and 24 or the appropriate surfaces of the base 12 and pins 16 and 18. Preferred solder compositions for this purpose are high-temperature alloys known and used in the industry. Alternatively, solder bumps could be formed on the contacts 20, 22 and 24. Fixturing (not shown) is preferably used to precisely locate and align the die 14 and pins 16 and 18 on the base 12, allowing all internal solder connections to be performed with a single pass through an oven.

FIG. 3 represents a third process step, in which a nonconductive sleeve 28 has been placed on the base 12 to surround the die 14 and the lower ends of the pins 16 and 18. The sleeve 28 is preferably secured to the base 12 by an interference fit between the inner diameter of the sleeve 28 and a boss 30 on the base 12. A suitable material for the sleeve 28 is a phenolic available under the name PHE-NOLKRAFT® from Accurate Plastics, Inc., though other nonconductive materials could be used. A final preferred assembly step is to seal the package 10 by filling the cavity defined by the sleeve 28 with a suitable encapsulating material. While various materials could be used, a preferred material is an epoxy, such as epoxies available under the names EO1072, FP4450 and FP4457 from Dexter Electronic Materials Division. As a result of the encapsulation step, the upper surface 26 of the base 12, the die 14, and the lower ends of the pins 16 and 18 are all protectively encased, and the physical robustness of the solder connections between the pins 16 and 18 and the die 14 is promoted.

Figure 4:
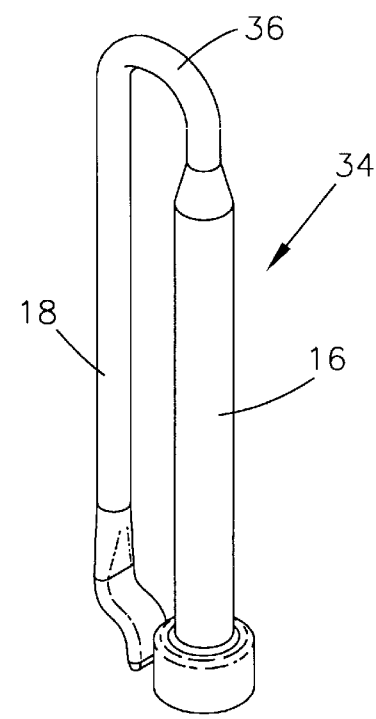
FIG. 4 is a side view illustrating a multi-pin unit that may be used with the package of the first embodiment.

As seen from FIGS. 1 through 3, the base 12 is sized and provided with ribbing 32 to allow the package 10, via the base 12, to be press-fit into an appropriate opening in a rectifier bridge bracket. The pins 16 and 18 are preferably brazed to the system level source and gate connections, respectively, of the bridge circuit. The base 12 and pins 16 and 18 are preferably formed of a highly conductive material, such as copper plated with an electroless nickel. To facilitate brazing, the pins 16 and 18 are preferably plated with an electroless nickel that has a high phosphorous content, for example, about 12 weight percent. The pin 16 is shown as being much larger than the pin 18, both in terms of diameter and length. The larger diameter of the pin 16 is due to the much greater current carried by the pin 16 as compared to the pin 18. The height difference between the pins 16 and 18 is to facilitate system level connections. The pin 18 is effectively the third lead of the package 10, and therefore can be seen to readily distinguish the package 10 from prior art diode-based packages. While FIGS. 1 and 2 represent the pins 16 and 18 as being discrete components that must be individually aligned with their respective contacts 20 and 24 on the die 14, FIG. 4 represents an alternative approach in which the pins 16 and 18 are formed as part of a single pin unit 34. The pin unit 34 has a U-shaped connector region 36 between the pins 16 and 18. After placement of the unit 34 on the die 14, by which the pins 16 and 18 are simultaneously aligned with their contacts 20 and 24, the connector region 36 is removed by clipping or any other suitable technique to yield the two discrete pins 16 and 18.

Figure 5:
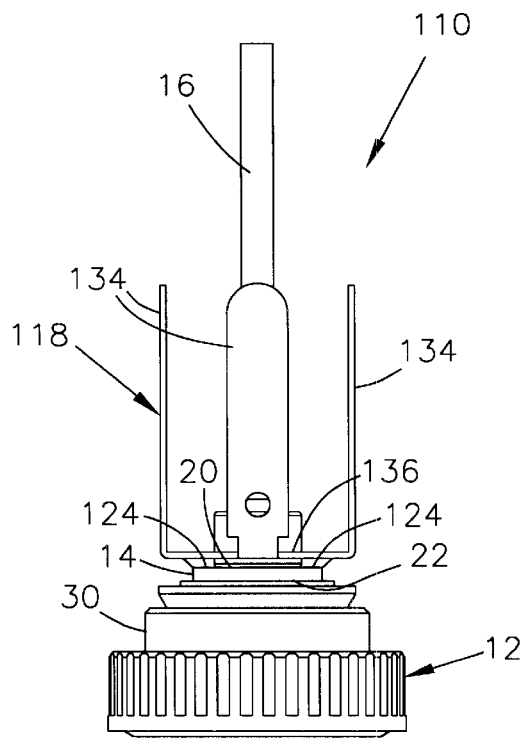
FIGS. 5, 6 and 7 are side views of packages in accordance with alternative embodiments of this invention, and illustrate the packages at a process stage corresponding to FIG. 2 of the first embodiment.

In the second embodiment of the invention represented in FIG. 5, a package 110 is shown in which the pin 18 shown in FIGS. 1 through 4 has been replaced with a leadframe 118. The other components of the package 110 can otherwise be identical to those in FIGS. 1 through 3, and therefore are identified by the same reference numbers. FIG. 5 represents the package 110 at the same process level as that represented in FIG. 2, i.e., prior to installation of the sleeve 28 and encapsulation. The leadframe 118 is shown as having four blade-like fingers 134 extending from a central web 136 so as to be substantially parallel to the pin 16. Electrical contact between the leadframe 118 and the gate region of the MOSFET die 14 is preferably through soldering the web 136 to four gate contacts 124 provided at the four corners of the die 14. For this purpose, if the leadframe 118 is formed of a nonsolderable material such as copper, the surface regions of the web 136 to be soldered to the contacts 124 are preferably rendered solderable by spot plating. Solder bumps or another suitable bump structure can be formed on the gate contacts 124 or the mating surface regions of the web 136 to allow joining by a solder reflow operation. The fingers 134 of the leadframe 118 can be connected to the rectifier circuit by brazing, soldering or staking.

Figure 6:
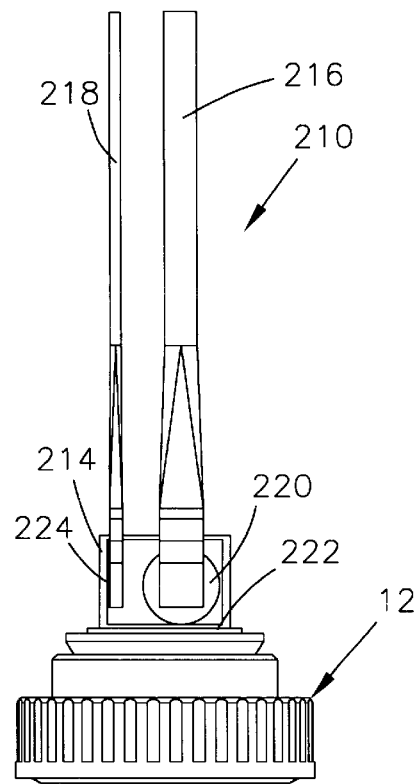

In FIG. 6, a package 210 configured in accordance with a third embodiment of the invention is represented. As with FIG. 5, FIG. 6 represents the package 210 at the same process level as that represented in FIG. 2, i.e., prior to installation of the sleeve 28 and encapsulation. The package 210 differs from that shown in FIGS. 1 through 3 primarily by the orientation of the MOSFET die 214, which is shown as being attached on-edge to the base 12. An advantage of the package 210 is its ease of assembly due to the resulting coplanar orientation of the pins 216 and 218. As before, the base 12 is electrically connected to a drain contact 222 on the die 214, while pins 216 and 218 are electrically connected to the source and gate contacts 220 and 224, respectively. The connections between the die 214 and the pins 216 and 218 are again preferably made by soldering. As a result of the orientation of the die 14 to the base 12, the pins 216 and 218 are substantially parallel to the surface of the die 14 on which the contacts 220 and 224 are formed. Consequently, the lower ends of the pins 216 and 218 preferably have a blade-like shape to provide greater surface contact with the contacts 220 and 224. Other than the above-noted differences, the embodiment of FIG. 6 is substantially identical to that of FIGS. 1 through 3.

FIGS. 7 through 10 represent IC power packages in which the additional "third" lead necessitated by the MOSFET die 14 is not a pin or blade, but instead is a ring 318/418 secured to the sleeve 28 opposite the base 12. Furthermore, the ring 318/418 is electrically connected to the gate contact 324/424 of the die 14 by wire bonding instead of soldering.

Figure 7:
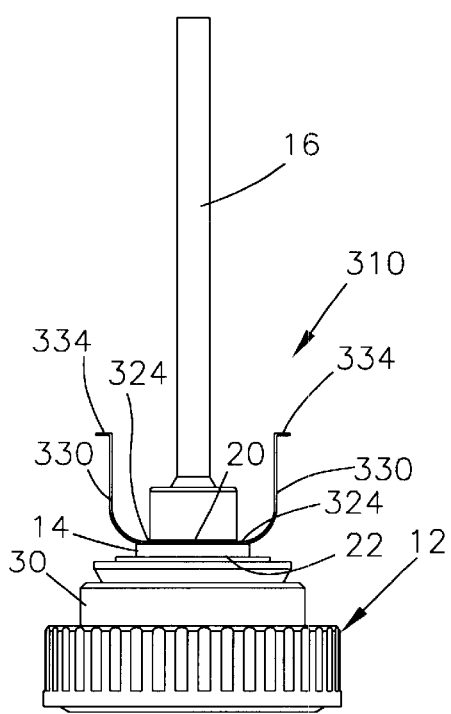
Figure 8:
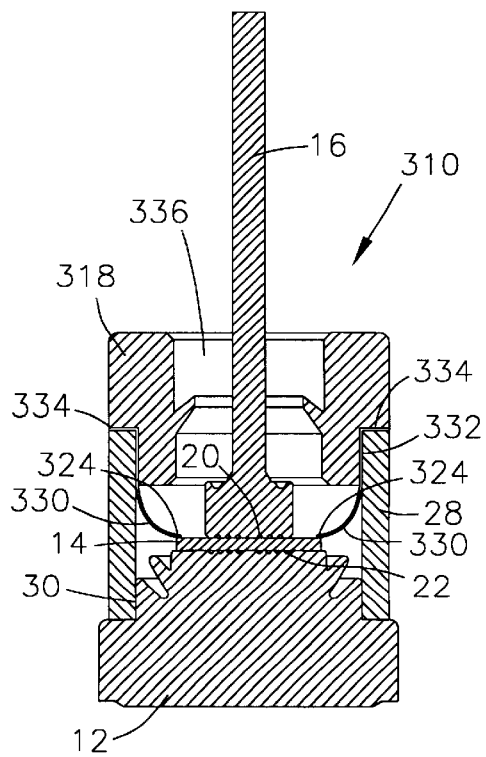
FIG. 8 is a cross sectional view of the final package for the embodiment illustrated in FIG. 7.

In FIGS. 7 and 8, a package 310 is represented at the same process levels as those represented in FIGS. 2 and 3, respectively. As before, the base 12 is electrically connected to the drain contact 22 on the die 14, while the pin 16 is electrically connected to the source contact 20. The connections between the base 12, die 14 and pin 16 are again preferably made by soldering. The pin 18 shown in FIGS. 1 through 4 has been replaced with an electrically-conductive ring 318 shown as being mounted to the sleeve 28 in FIG. 8. The ring 318 is shown as having a boss 332 by which the ring 318 is secured to the sleeve 28 with an interference fit. Because the sleeve 28 is formed of a nonconductive material (e.g., a phenolic), the sleeve 28 serves to electrically insulate the ring 318 from the base 12. The electrical connection between the ring 318 and the gate region 324 of the die 14 is made through bond wires 330 that are bonded in accordance with known wire-bonding techniques to gate contacts 324 provided at the corners of the die 14. Electrical connection to the ring 318 is made by forming the wires 330 so that their ends 334 are secured by the interference fit between the ring 318 and the sleeve 28.

Once the ring 318 is in place, the interior cavity 336 defined by the sleeve 28 and the ring 318 can be filled with a suitable encapsulant (not shown). As with the previous embodiments, the base 12, pin 16 and ring 318 are all preferably formed of electroless nickel-plated copper, with electroless nickel having a high phosphorous content being preferred for the pin 16 to promote brazeability. Electrical connection of the ring 318 to the rectifier circuit is preferably made by press fitting a bracket or clip (not shown) onto the ring 318.

Figure 9:
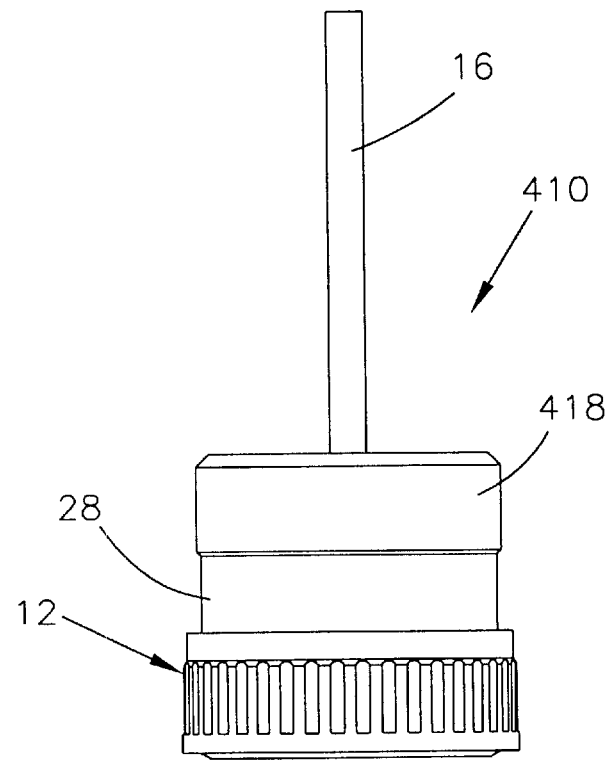
FIGS. 9 and 10 are side and end views, respectively, of a package in accordance with a preferred embodiment of this invention, and illustrate the package prior to encapsulation.
Figure 10:
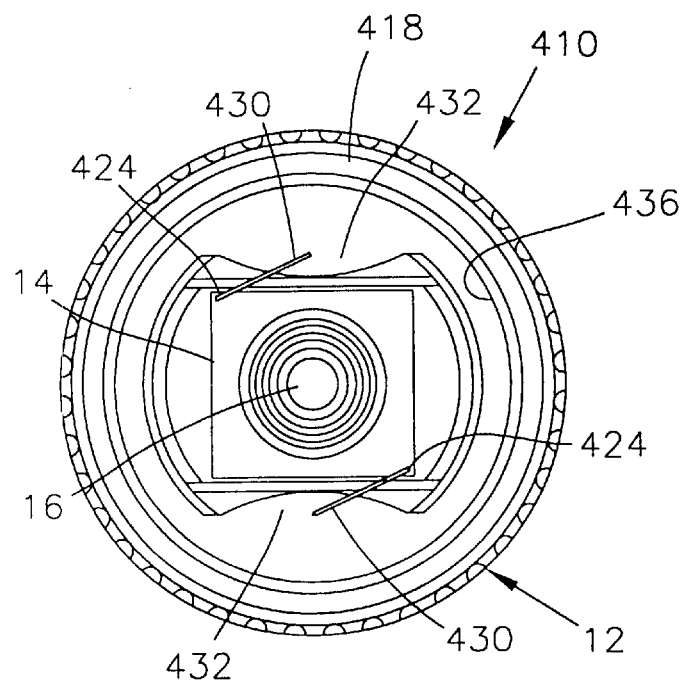

In a final and preferred embodiment of this invention, a package 410 is represented in FIGS. 9 and 10 at the same process level as that represented in FIG. 3, i.e., prior to encapsulation. FIG. 10 is an end view looking toward the pin 16. As before, the base 12 and pin 16 are electrically connected to the drain and source contacts (not shown) on the die 14, again preferably by soldering. In this embodiment, the pin 18 shown in FIGS. 1 through 4 has been replaced with an electrically-conductive ring 418 mounted to the sleeve 28 in the same manner described in reference to FIG. 8. In contrast to the embodiment of FIGS. 7 and 8, the ring 418 is electrically connected to two gate contacts 424 on the die 14 through bond wires 430 that are ball bonded to the gate contacts 424 and wedge bonded to flanges 432 defined on the interior of the ring 418. A suitable wire bonding process entails ultrasonic welding gold wires having diameters on the order of about 0.001 to 0.0015 inch (about 25 to 38 micrometers), and employs commercially available equipment such as a process and equipment available from Palomar Technologies, Inc. The sleeve 28 and ring 418 are assembled to the base 12 prior to wire bonding, after which the interior cavity 436 defined by the sleeve 28 and the ring 418 can be filled with a suitable encapsulant (not shown). The package 410 of FIGS. 9 and 10 is a particularly preferred embodiment of the invention because of the symmetry provided by its three electrical connections 12, 16 and 418, which simplifies the assembly and use of the package 410.

As with the embodiment of FIGS. 7 and 8, the base 12, pin 16 and ring 418 are all preferably formed of electroless nickel-plated copper, with the electroless nickel plating of the pin 16 having a high phosphorous content to promote brazeability. Also according to the previous embodiment, the electrical connection of the ring 418 to the rectifier circuit can be made by press fitting a bracket or clip (not shown) onto the ring 418.

In view of the above, it can be appreciated that the base 12 and pin 16 of each IC package of this invention can be substantially similar to that of a conventional diode-based rectifier package. Therefore, the IC packages of this invention are compatible with existing generator rectifier bridge designs, so that only minimal modifications are required to use the package with conventional generator designs. The packaging methods entailed by this invention are also uncomplicated, and amenable to fixturing and conventional processing to yield a package whose base 12, pin 16 and "third" lead 18, 118, 218, 318 or 418 are precisely aligned for installation. While the invention has been described in terms of particular and preferred embodiments, it is apparent that other forms could be adopted by one skilled in the art. Accordingly, the scope of the invention is to be limited only by the following claims.

What is claimed is:

1. An IC power package comprising:
   an electrically-conductive base;
   a MOSFET die mounted to the base, the die having a drain region, a source region and a gate region, the drain region being electrically connected to the base;
   an electrically-conductive pin mounted to the die and electrically connected to the source region, the pin being mounted to the die so as to be centrally-disposed along an axis of the base; and
   an electrically-conductive member electrically connected to the gate region.

2. The IC power package according to claim 1, wherein the electrically-conductive member is a second pin mounted to the die.

3. The IC power package according to claim 1, wherein the electrically-conductive member is leadframe mounted to the die, the leadframe comprising a plurality of fingers.

4. The IC power package according to claim 3, wherein each of the fingers is substantially parallel to the pin.

5. The IC power package according to claim 1, wherein the die is mounted to the base at an edge of the die, and the pin and electrically-conductive member are substantially parallel to the die.

6. The IC power package according to claim 1, wherein the electrically-conductive member is an annular-shaped member.

7. The IC power package according to claim 6, further comprising an electrically-insulative member that electrically insulates the annular-shaped member from the base.

8. The IC power package according to claim 7, wherein the electrically-insulative member is a sleeve mounted to the base, the annular-shaped member being mounted on the sleeve.

9. The IC power package according to claim 8, wherein the annular-shaped member is electrically connected to the gate region with a bond wire.

10. The IC power package according to claim 9, wherein the bond wire has one end clamped between the annular-shaped member and the sleeve.

11. The IC power package according to claim 9, wherein the bond wire has a first end ball-bonded to the die and a second end wedge-bonded to the annular-shaped member.

12. The IC power package according to claim 11, wherein the annular-shaped member has at least one interior surface to which the second end of the bond wire is wedge-bonded.

13. The IC power package according to claim 1, further comprising an electrically-insulative sleeve mounted to the base and surrounding the die, at least a portion of the pin, and at least a portion of the electrically-conductive member.

14. The IC power package according to claim 13, further comprising an encapsulation material within the sleeve that encapsulates the die and the portion of the pin within the sleeve.

15. The IC power package according to claim 1, wherein the electrically-conductive member is a second pin mounted to the die so as to be offset and parallel to the pin.

16. An IC power package of an ac generator rectifier bridge, the package comprising:
   an electrically-conductive base having an axis, a circular-shaped perimeter circumscribing the axis, and an axial surface;
   a MOSFET die mounted to the axial surface of the base, the die having a first surface and an oppositely-disposed second surface, a drain region, a drain contact on the second surface and electrically-connected to the drain region, a source region, a source contact on the first surface and electrically-connected to the source region, a gate region, and a gate contact on the first surface and electrically-connected to the gate region, the drain contact being electrically connected to the base;

an electrically-conductive pin mounted to the die and electrically connected to the source contact, the pin substantially coinciding with the axis of the base;

an electrically-conductive member electrically connected to the gate contact;

an electrically-insulative sleeve mounted to the base and surrounding the die, a limited portion of the pin, and a limited portion of the electrically-conductive member; and an encapsulation material within the sleeve that encapsulates the die and the portion of the pin within the sleeve.

17. The IC power package according to claim 16, wherein the electrically-conductive member is a second pin mounted to the die.

18. The IC power package according to claim 17, wherein the second pin is soldered to the source contact of the die so as to be offset and parallel to the pin.

19. The IC power package according to claim 18, wherein the second pin is shorter and than the pin and has a cross-section that is smaller than the pin.

20. The IC power package according to claim 16, wherein the electrically-conductive member is leadframe mounted to the die, the leadframe comprising a plurality of fingers.

21. The IC power package according to claim 20, wherein each of the fingers is substantially parallel to the pin.

22. The IC power package according to claim 21, wherein each of the fingers is blade-shaped.

23. The IC power package according to claim 20, wherein the die comprises four gate contacts, each of the gate contacts being at one of four corners of the die, the leadframe being soldered to each of the four gate contacts.

24. The IC power package according to claim 16, wherein the die is mounted to the base along an edge of the die, and the pin and electrically-conductive member are soldered to and substantially parallel to the first surface of the die.

25. The IC power package according to claim 16, wherein the electrically-conductive member is an annular-shaped member mounted to the sleeve so that the sleeve separates and electrically insulates the annular-shaped member from the base.

26. The IC power package according to claim 25, wherein the annular-shaped member is electrically connected to the gate contact of the die with a bond wire.

27. The IC power package according to claim 26, wherein the bond wire has one end clamped between the annular-shaped member and the sleeve.

28. The IC power package according to claim 26, wherein the bond wire has a first end ball-bonded to the gate contact and a second end wedge-bonded to the annular-shaped member.

29. The IC power package according to claim 28, wherein the annular-shaped member has at least one interior surface to which the second end of the bond wire is wedge-bonded.

30. The IC power package according to claim 16, wherein the sleeve is secured by an interference fit to the base.

31. An IC power package of an ac generator rectifier bridge, the package comprising:

an electrically-conductive base having an axis, a circular-shaped perimeter circumscribing the axis, and an axial surface;

a MOSFET die mounted to the axial surface of the base, the die having a first surface and an oppositely-disposed second surface, a drain region, a drain contact on the second surface and electrically-connected to the drain region, a source region, a source contact on the first surface and electrically-connected to the source region, a gate region, and a gate contact on the first surface and electrically-connected to the gate region, the drain contact being electrically connected to the base;

an electrically-conductive pin mounted to the die and electrically connected to the source contact, the pin substantially coinciding with the axis of the base;

an electrically-insulative sleeve mounted to the base and surrounding the die and a limited portion of the pin;

an electrically-conductive ring mounted to the sleeve and surrounding the pin, the sleeve separating and electrically insulating the ring from the base;

a bond wire electrically connecting the ring to the gate contact; and an encapsulation material within the sleeve that encapsulates the die, the limited portion of the pin, and the bond wire within the sleeve.

32. The IC power package according to claim 31, wherein the bond wire has one end clamped between the ring and the sleeve.

33. The IC power package according to claim 31, wherein the bond wire has a first end ball-bonded to the gate contact and a second end wedge-bonded to the ring.

34. The IC power package according to claim 33, wherein the ring has at least one interior surface to which the second end of the bond wire is wedge-bonded.

35. The IC power package according to claim 31, wherein the sleeve is secured by an interference fit to the base and the ring is secured by an interference fit to the sleeve.

36. An IC power packaging method comprising the steps of:

providing an electrically-conductive base;

mounting a MOSFET die mounted to the base, the die having a drain region, a source region and a gate region, the drain region being electrically connected to the base;

mounting an electrically-conductive pin to the die so as to be electrically connected to the source region and centrally-disposed along an axis of the base; and electrically connecting an electrically-conductive member to the gate region.

37. The IC power packaging method according to claim 36, wherein the electrically-conductive member is formed as a second pin and is mounted to the die.

38. The IC power packaging method according to claim 37, further comprising the steps of:

forming the pin and the second pin as a U-shaped multi-pin unit in which the pin and the second pin are connected by a connection region, wherein the pin and the second pin are simultaneously mounted to the die by registering the multi-pin unit with the die; and then removing the connection region from the multi-pin unit to separate the pin and the second pin.

39. The IC power packaging method according to claim 36, wherein the electrically-conductive member is formed as a leadframe and is mounted to the die, the leadframe comprising a plurality of fingers that are each substantially parallel to the pin.

40. The IC power packaging method according to claim 36, wherein the die is mounted to the base at an edge of the die, and the pin and electrically-conductive member are mounted to the die so as to be substantially parallel to the die.

41. The IC power packaging method according to claim 36, wherein the electrically-conductive member is formed as an annular-shaped member, the IC power packaging method further comprising the step of mounting an electrically-insulative member to the base to electrically insulate the annular-shaped member from the base.

42. The IC power packaging method according to claim 41, wherein the electrically-insulative member is formed as a sleeve and is mounted to the base.

43. The IC power packaging method according to claim 42, wherein the annular-shaped member is mounted on the sleeve.

44. The IC power packaging method according to claim 42, wherein the annular-shaped member is electrically connected to the gate region with a bond wire.

45. The IC power packaging method according to claim 44, wherein the bond wire has one end clamped between the annular-shaped member and the sleeve.

46. The IC power packaging method according to claim 44, wherein the bond wire has a first end ball-bonded to the die and a second end wedge-bonded to the annular-shaped member.

47. The IC power packaging method according to claim 46, wherein the annular-shaped member has at least one interior surface to which the second end of the bond wire is wedge-bonded.

48. The IC power packaging method according to claim 36, further comprising the step of mounting an electrically-insulative sleeve to the base so as to surround the die, at least a portion of the pin, and at least a portion of the electrically-conductive member.

49. The IC power packaging method according to claim 48, further comprising the step of depositing an encapsulation material within the sleeve to encapsulate the die and the portion of the pin within the sleeve.

50. The IC power packaging method according to claim 36, wherein the electrically-conductive member is formed as a second pin that is mounted to the die so as to be offset and parallel to the pin.

51. A method of packaging an IC power package for an ac generator rectifier bridge, the method comprising the steps of:
    forming an electrically-conductive base having an axis, a circular-shaped perimeter circumscribing the axis, and an axial surface;
    mounting a MOSFET die to the axial surface of the base, the die having a first surface and an oppositely-disposed second surface, a drain region, a drain contact on the second surface and electrically-connected to the drain region, a source region, a source contact on the first surface and electrically-connected to the source region, a gate region, and a gate contact on the first surface and electrically-connected to the gate region, the die being mounted to the base so that the drain contact is electrically connected to the base;
    mounting an electrically-conductive pin to the die so as to be electrically connected to the source contact, the pin being mounted so as to substantially coincide with the axis of the base;
    mounting an electrically-insulative sleeve to the base so as to surround the die and a limited portion of the pin;
    mounting an electrically-conductive ring to the sleeve so as to surround the pin and so that the sleeve separates and electrically insulates the ring from the base;
    electrically connecting the ring to the gate contact with a bond wire; and
    depositing an encapsulation material within the sleeve to encapsulates the die, the limited portion of the pin, and the bond wire within the sleeve.

52. The method according to claim 51, wherein the bond wire has one end clamped between the ring and the sleeve.

53. The method according to claim 51, wherein the bond wire has a first end ball-bonded to the gate contact and a second end wedge-bonded to the ring.

54. The method according to claim 53, wherein the ring has at least one interior surface to which the second end of the bond wire is wedge-bonded.

55. The method according to claim 51, wherein the sleeve is secured by an interference fit to the base and the ring is secured by an interference fit to the sleeve.

* * * * *